(12) United States Patent
Kim

(10) Patent No.: US 7,199,628 B2
(45) Date of Patent: Apr. 3, 2007

(54) POWER SUPPLY APPARATUS FOR DELAY LOCKED LOOP AND METHOD THEREOF

(75) Inventor: Kyung-Hoon Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 130 days.

(21) Appl. No.: 10/877,601

(22) Filed: Jun. 24, 2004

(65) Prior Publication Data

US 2005/0093596 A1    May 5, 2005

(30) Foreign Application Priority Data

Oct. 30, 2003   (KR) ...................... 10-2003-0076267

(51) Int. Cl.
*H03L 7/06* (2006.01)

(52) U.S. Cl. ........................ 327/158; 327/143; 327/539

(58) Field of Classification Search ...................... None
See application file for complete search history.

(56) References Cited

U.S. PATENT DOCUMENTS

| | | | | |
|---|---|---|---|---|
| 5,084,665 A | * | 1/1992 | Dixon et al. ................. | 323/281 |
| 5,747,978 A | * | 5/1998 | Gariboldi et al. ........... | 323/313 |
| 6,411,544 B1 | * | 6/2002 | Devin ................... | 365/185.01 |
| 6,661,213 B2 | * | 12/2003 | Fayneh et al. .............. | 323/280 |
| 6,815,998 B1 | * | 11/2004 | Samad ........................ | 327/530 |

* cited by examiner

*Primary Examiner*—Timothy P. Callahan
*Assistant Examiner*—An T. Luu
(74) *Attorney, Agent, or Firm*—Blakely Sokoloff Taylor & Zafman

(57) ABSTRACT

A DLL voltage supply device for use in a semiconductor memory device includes: a bandgap voltage generating means for generating a bandgap voltage by using an external power supply voltage; a voltage level shifter for increasing a voltage level of the bandgap voltage in order to output an increased bandgap voltage as a DLL voltage; and a voltage level keep means for outputting the external power supply voltage as the DLL voltage if the increased bandgap voltage is lower than a predetermined voltage level.

20 Claims, 4 Drawing Sheets

POWER SUPPLY APPARATUS FOR DELAY LOCKED LOOP AND METHOD THEREOF

FIELD OF INVENTION

The present invention relates to a semiconductor device; and, more particularly, to a power supply apparatus for supplying power to a delay locked loop (DLL).

DESCRIPTION OF PRIOR ART

A voltage required for operating a delay locked loop (DLL), namely a DLL voltage should hold a steady voltage level independent of an external power supply voltage. It is also required that the DLL voltage should be stable regardless of noises caused by the external power supply voltage and an internal circuit of a DLL voltage supply device.

FIG. 1 is a block diagram showing a conventional DLL voltage supply device.

As shown, the conventional DLL voltage supply device includes a bandgap voltage generator 110, a voltage level shifter 120 and a DLL 130.

The bandgap voltage generator 110 generates a bandgap voltage $V_{bg}$ which is steady, i.e., not influenced by some variations such as power, voltage and temperature.

The voltage level shifter 120 increases a voltage level of the bandgap voltage $V_{bg}$ for raising the voltage level of the bandgap voltage $V_{bg}$ to the required voltage level to operate the DLL 130. As a result, the voltage level shifter 120 outputs a DLL voltage $V_{DLL}$ for operating the DLL 130.

FIG. 2 is a schematic circuit diagram showing the voltage level shifter 120 shown in FIG. 1.

As shown, the voltage level shifter 120 includes an amplifying unit 210, a p-channel metal oxide semiconductor (PMOS) driver 220 and a resistor unit 230.

At initial state, the amplifying unit 210 compares the bandgap voltage $V_{bg}$ with a feed-back voltage $V_{fb}$ to determine whether or not the bandgap voltage $V_{bg}$ and the feed-back voltage $V_{fb}$ have a same voltage level.

If the bandgap voltage $V_{bg}$ is higher than the feed-back voltage $V_{fb}$, a lower current is flown on a first n-channel metal oxide semiconductor (NMOS) transistor MN1 than that of a second NMOS transistor MN2. Therefore, a voltage on a gate of a PMOS transistor MP1 is lowered, whereby a voltage level of the feed-back voltage $V_{fb}$ is raised.

On the other hand, if the bandgap voltage $V_{bg}$ is lower than the feed-back voltage $V_{fb}$, a higher current is flown on the first NMOS transistor MN1 than that of the second NMOS transistor MN2. Therefore, a voltage on the gate of the PMOS transistor MP1 is raised, whereby a voltage level of the feed-back voltage $V_{fb}$ is lowered.

As a result, the bandgap voltage $V_{bg}$ and the feed-back voltage $V_{fb}$ have a same voltage level during a normal operation.

Herein, the bandgap voltage $V_{bg}$ holds a steady voltage level even though a power supply voltage VDD is changed. On the other hand, since the feed-back voltage $V_{fb}$ is generated by using the DLL voltage $V_{DLL}$, a voltage level of the feed-back voltage $V_{fb}$ is lowered if a voltage level of the DLL voltage $V_{DLL}$ is lowered.

The resistor unit 230 is a voltage divider for outputting the feed-back voltage $V_{fb}$ to the amplifying unit 210 and raises a voltage level of the feed-back voltage $V_{fb}$ to a voltage level of the DLL voltage $V_{DLL}$. The PMOS driver 220 outputs the DLL voltage $V_{DLL}$.

FIG. 3 is a linear diagram showing a relation between the power supply voltage VDD and the DLL voltage $V_{DLL}$.

As shown, as a voltage level of the power supply voltage VDD is lowered, a voltage level of the DLL voltage $V_{DLL}$ is also lowered. Herein, when voltage levels of the power supply voltage VDD and the DLL voltage $V_{DLL}$ are lowered, a voltage level of the DLL voltage $V_{DLL}$ is always lower than that of the power supply voltage VDD by a constant voltage value.

Since the PMOS transistor MP1 is saturated, a voltage level of the DLL voltage $V_{DLL}$ is lower than that of the power voltage VDD by a drain-source voltage of the PMOS transistor MP1, i.e., the constant voltage level.

Therefore, when a voltage level of the power supply voltage VDD is lowered, the DLL 130 can be operated abnormally because of an insufficient voltage level of the DLL voltage $V_{DLL}$.

SUMMARY OF INVENTION

It is, therefore, an object of the present invention to provide a DLL power supply device capable of keeping a DLL voltage level equal to a power supply voltage level when the DLL voltage level becomes lower than a minimum voltage level required for a DLL to operate stably.

In accordance with an aspect of the present invention, there is provided a DLL voltage supply device for use in a semiconductor memory device including: a bandgap voltage generating means for generating a bandgap voltage by using an external power supply voltage; a voltage level shifter for increasing a voltage level of the bandgap voltage in order to output an increased bandgap voltage as a DLL voltage; and a voltage level keep means for outputting the external power supply voltage as the DLL voltage if the increased bandgap voltage is lower than a predetermined voltage level.

In accordance with another aspect of the present invention, there is provided a method of supplying power to a DLL included in a semiconductor memory device including a step of: generating a bandgap voltage which is steady and is not influenced by external conditions by using an external power supply voltage; shifting the bandgap voltage to a first voltage and outputting the first voltage as a DLL voltage when the external power supply voltage is higher than a predetermined voltage level; and outputting the external power supply voltage as the DLL voltage when the external power supply voltage is lower than the predetermined voltage level.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF INVENTION

Hereinafter, a power supply device for a DLL in accordance with the present invention will be described in detail referring to the accompanying drawings.

Figure 1:
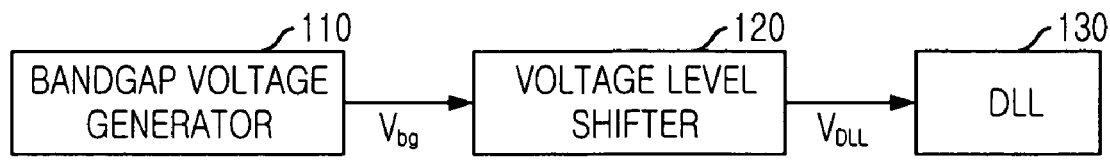
FIG. 1 is a block diagram showing a conventional DLL voltage supply device.
Figure 2:
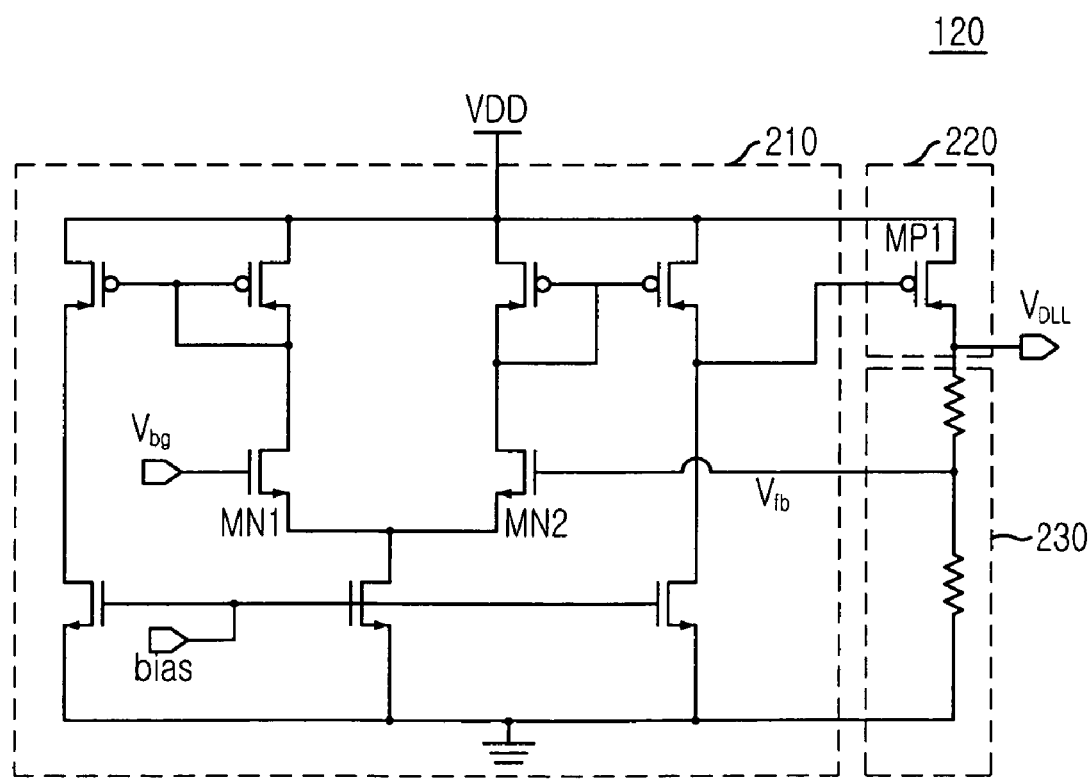
FIG. 2 is a schematic circuit diagram showing a voltage level shifter shown in FIG. 1.
Figure 3:
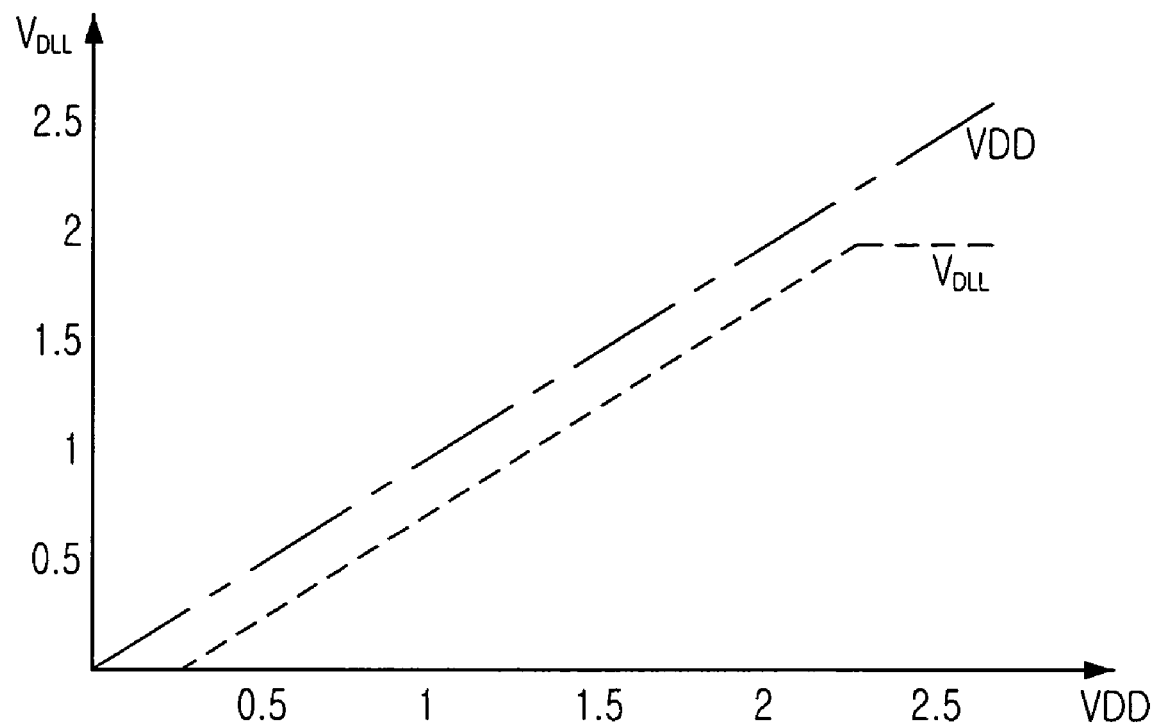
FIG. 3 is a linear diagram showing a relation between a power supply voltage and a DLL voltage.
Figure 4:
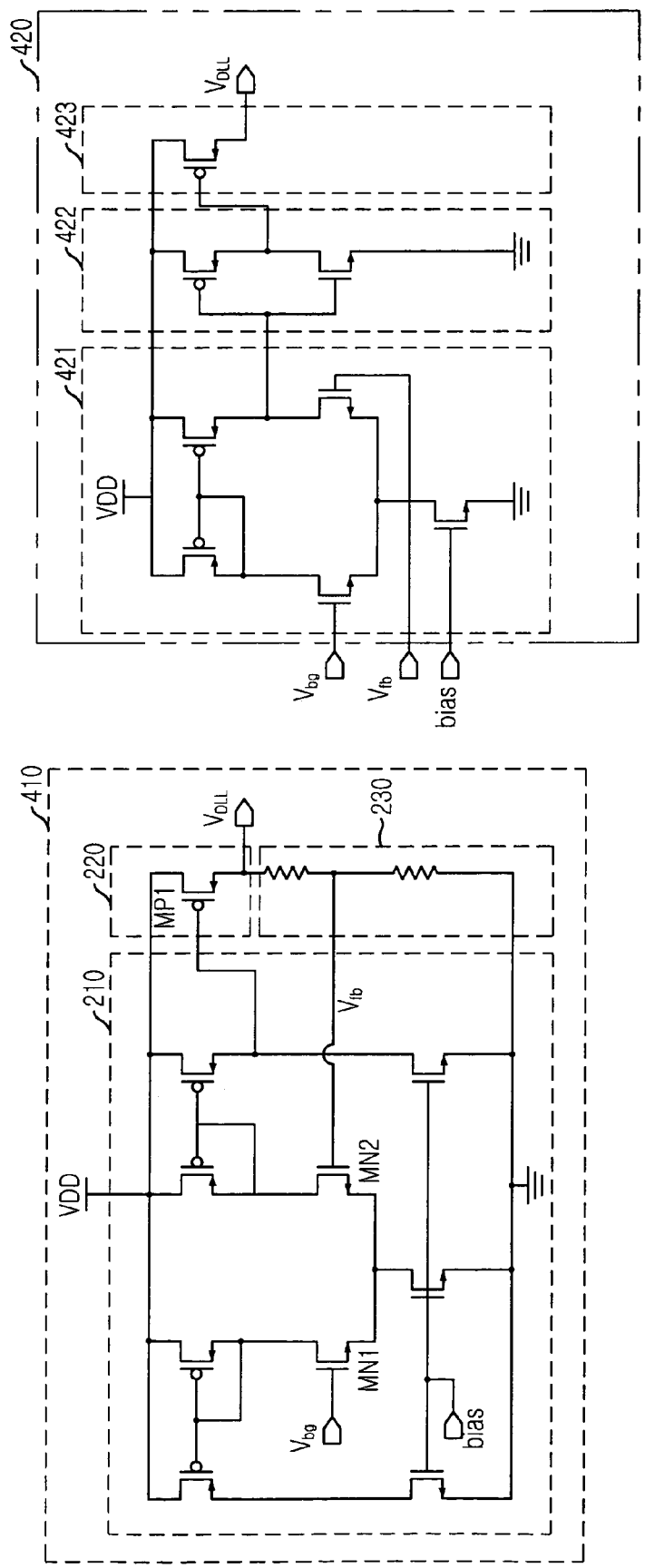
FIG. 4 is a schematic circuit diagram showing a DLL voltage generating unit included in a DLL power supply device in accordance with a preferred embodiment of the present invention.

FIG. 4 is a schematic circuit diagram showing a DLL voltage generating unit included in a DLL power supply device in accordance with a preferred embodiment of the present invention.

As shown, the DLL voltage generating unit includes a voltage level shifter 410 and a voltage level protection unit 420.

The voltage level shifter 410 includes an amplifying unit 210, a first p-channel metal oxide semiconductor (PMOS) driver 220 and a resistor unit 230.

At initial state, the amplifying unit 210 compares a bandgap voltage $V_{bg}$ with a feed-back voltage $V_{fb}$ to determine whether or not the bandgap voltage $V_{bg}$ and the feed-back voltage $V_{fb}$ have a same voltage level.

If the bandgap voltage $V_{bg}$ is higher than the feed-back voltage $V_{fb}$, a lower current is flown on a first n-channel metal oxide semiconductor (NMOS) transistor MN1 than that of a second NMOS transistor MN2. Therefore, a voltage on a gate of a PMOS transistor MP1 is lowered, whereby a voltage level of the feed-back voltage $V_{fb}$ is raised.

On the other hand, if the bandgap voltage $V_{bg}$ is lower than the feed-back voltage $V_{fb}$, a higher current is flown on the first NMOS transistor MN1 than that of the second NMOS transistor MN2. Therefore, a voltage on the gate of the PMOS transistor MP1 is raised, whereby a voltage level of the feed-back voltage $V_{fb}$ is lowered.

As a result, the bandgap voltage $V_{bg}$ and the feed-back voltage $V_{fb}$ have a same voltage level during a normal operation.

Herein, the bandgap voltage $V_{bg}$ holds a steady voltage level even though a power supply voltage VDD is changed. On the other hand, since the feed-back voltage $V_{fb}$ is generated by using the DLL voltage $V_{DLL}$, a voltage level of the feed-back voltage $V_{fb}$ is lowered if a voltage level of the DLL voltage $V_{DLL}$ is lowered.

The resistor unit 230 is a voltage divider for outputting the feed-back voltage $V_{fb}$ to the amplifying unit 210 and raises a voltage level of the feed-back voltage $V_{fb}$ to a voltage level of the DLL voltage $V_{DLL}$. The PMOS driver 220 outputs the DLL voltage $V_{DLL}$.

The voltage level protection unit 420 includes a comparing unit 421, an inverting unit 422 and a second PMOS driver 423.

The comparing unit 421 detects a voltage difference between the bandgap voltage $V_{bg}$ and the feed-back voltage $V_{fb}$ in order to amplify the voltage difference. Herein, the bandgap voltage $V_{bg}$ and the feed-back voltage $V_{fb}$ can have a minute voltage difference due to some variations during a manufacturing process. Therefore, the comparing unit 421 has a small amplification gain.

However, if a power supply voltage VDD becomes lower than a predetermined voltage level, the feed-back voltage $V_{fb}$ becomes lower than the bandgap voltage $V_{bg}$ by a large amount of a voltage value, i.e., they have a wide voltage difference.

Because of the wide voltage difference between the feed-back voltage $V_{fb}$ and the bandgap voltage $V_{bg}$, an output signal of the comparing unit 421 has a higher voltage level than that of a logic high voltage. Herein, the logic high voltage is a required maximum voltage for an output signal of the inverting unit 422 to be in a logic low level.

The comparing unit 421 is designed so that its output signal can have a lower voltage level than that of a logic low voltage during an initial state. Herein, the logic low voltage is a required minimum voltage for the output signal of the inverting unit 422 to be in a logic high level.

Meanwhile, if the output signal of the inverting unit 422 is in a logic low level when the power supply voltage VDD is lower than the predetermined voltage level, a PMOS transistor included in the PMOS driver is operated in a linear region. Therefore, the PMOS transistor is turned on connecting the DLL voltage $V_{DLL}$ to the power supply voltage VDD. As a result, the power supply voltage VDD is outputted as the DLL voltage $V_{DLL}$.

Herein, for equalizing the DLL voltage to the power supply voltage VDD, a resistance of the PMOS transistor is required to be very small, and, thus a size of the PMOS transistor is required to be large.

The operation of the DLL voltage generating unit is described below referring to FIG. 4.

As shown in FIG. 4, outputs of the first DLL voltage generating unit 410 and the second DLL voltage generating unit 420 are connected each other.

When the power supply voltage VDD is higher than the predetermined voltage level, the first DLL voltage generating unit 410 normally outputs the DLL voltage $V_{DLL}$ as described above. At this time, the output of the inverting unit 422 is in a logic high level, and, thus the PMOS transistor included in the PMOS driver 423 is turned off. Therefore, the second DLL voltage generating unit 420 does not outputs the DLL voltage $V_{DLL}$ while the power supply voltage VDD is higher than the predetermined voltage level.

If the power supply voltage VDD is lower than the predetermined voltage level, the output signal of the inverting unit 422 is in a logic low level, and, thus the PMOS transistor is turned-on connecting the power supply voltage VDD to the DLL voltage $V_{DLL}$. Therefore, the power supply voltage VDD is outputted as the DLL voltage $V_{DLL}$.

Figure 5:
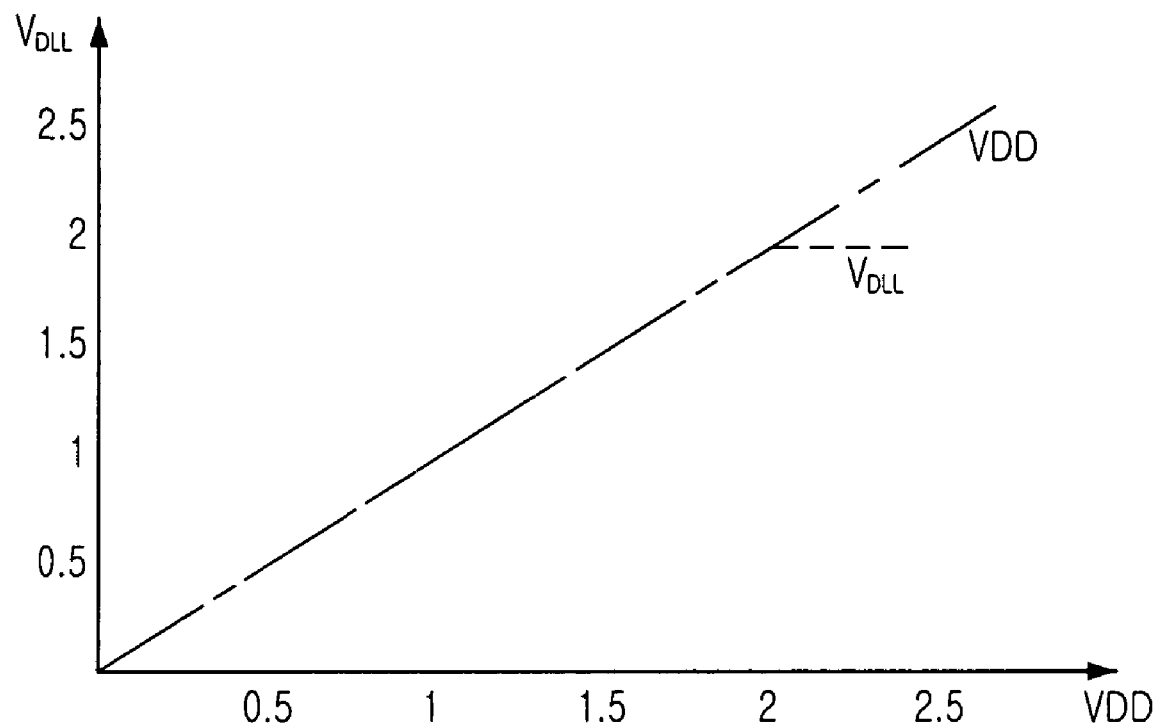
FIG. 5 is a linear diagram showing an operation of a second DLL voltage generating unit shown in FIG. 4.

FIG. 5 is a linear diagram showing the operation of the second DLL voltage generating unit 420.

As shown, as a voltage level of the power supply voltage VDD is lowered, the DLL voltage $V_{DLL}$ is lowered holding a same voltage level as that of the power supply voltage VDD.

Therefore, even though the power supply voltage VDD is lowered, the DLL voltage $V_{DLL}$ is not lowered than the power supply voltage VDD since the power supply voltage VDD is outputted as the DLL voltage $V_{DLL}$, whereby a DLL included in a semiconductor memory device can be operated stably.

The present application contains subject matter related to Korean patent application No. 2003-76267, filed in the Korean Patent Office on Oct. 30, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A delay locked loop (DLL) voltage supply device for use in a semiconductor memory device comprising:
    a bandgap voltage generating means for generating a bandgap voltage by using an external power supply voltage;
    a voltage level shifter for increasing a voltage level of the bandgap voltage in order to output an increased bandgap voltage as a DLL voltage; and
    a voltage level keep means for outputting the external power supply voltage as the DLL voltage if the increased bandgap voltage is lower than a predetermined voltage level,
    wherein the predetermined voltage level is a minimum voltage level required for a DLL to operate stably.

2. The DLL voltage supply device as recited in claim 1, wherein the voltage level shifter includes:
an amplifying unit for comparing the bandgap voltage with a feed-back voltage and amplifying the bandgap voltage to thereby output the amplified bandgap voltage;
a first driver which receives the amplified bandgap voltage for outputting the amplified bandgap voltage as the DLL voltage; and
a resistor unit for generating the feed-back voltage by voltage dividing the DLL voltage.

3. The DLL voltage supply device as recited in claim 2, wherein the voltage level keep means includes:
a comparing unit for comparing the bandgap voltage and the feed-back voltage;
an inverting unit for inverting an output signal from the comparing unit; and
a second driver for outputting the external power supply voltage as the DLL voltage in response to the output signal from the comparing unit.

4. The DLL voltage supply device as recited in claim 3, wherein the first driver and the second driver are PMOS drivers.

5. The DLL voltage supply device as recited in claim 4, wherein the PMOS driver included in the second driver is operated at a linear region.

6. The DLL voltage supply device as recited in claim 4, wherein a size of the PMOS transistor included in the second driver is larger than that of the PMOS transistor included in the first driver.

7. The DLL voltage supply device as recited in claim 2, wherein the resistor unit includes a plurality of resistors which are connected between an output of the first driver and a ground voltage.

8. The DLL voltage supply device as recited in claim 3, wherein the comparing unit receives the external power supply voltage to compare the bandgap voltage with the feed-back voltage.

9. A method of supplying power to a DLL included in a semiconductor memory device comprising a step of:
generating a bandgap voltage which is steady and is not influenced by external conditions by using an external power supply voltage;
shifting the bandgap voltage to a first voltage and outputting the first voltage as a DLL voltage when the external power supply voltage is higher than or equal to a predetermined voltage level; and
outputting the external power supply voltage as the DLL voltage when the external power supply voltage is lower than the predetermined voltage level.

10. The method of supplying power to a DLL included in a semiconductor memory device as recited in claim 9, wherein the step of shifting the bandgap voltage to the first voltage includes a step of:
comparing the bandgap voltage with a feed-back voltage to detect and amplify a voltage difference between the bandgap voltage and the feed-back voltage for outputting the amplified voltage difference;
controlling a voltage level of the external power supply voltage in response to the amplified voltage difference to thereby output the DLL voltage; and
outputting the feed-back voltage by dividing voltage of the DLL voltage.

11. The method of supplying power to a DLL included in a semiconductor memory device as recited in claim 10, wherein the step of outputting the external power supply voltage as the DLL voltage includes a step of:

comparing and amplifying the voltage difference between the bandgap voltage and the feed-back voltage;
inverting an signal level of the voltage difference; and
connecting the external power supply voltage to the DLL voltage in response to the inverted signal level of the voltage difference.

12. The method of supplying power to a DLL included in a semiconductor memory device as recited in claim 11, wherein the step of connecting the external power supply voltage to the DLL voltage is performed by a PMOS transistor.

13. The method of supplying power to a DLL included in a semiconductor memory device as recited in claim 12, wherein the PMOS transistor is operated during a linear region.

14. A semiconductor memory device for supplying power to a DLL, comprising:
a bandgap voltage generating means for generating a bandgap voltage by using an external power supply voltage;
a voltage level shifter for increasing a voltage level of the bandgap voltage in order to output an increased bandgap voltage as a DLL voltage; and
a voltage level keep means for outputting the external power supply voltage as the DLL voltage if the increased bandgap voltage is lower than a predetermined voltage level which is a minimum voltage level required for a DLL to operate stably,
wherein the voltage level keep means includes:
a comparing unit for comparing the bandgap voltage and the feed-back voltage;
an inverting unit for inverting an output signal from the comparing unit; and
a first driver for outputting the external power supply voltage as the DLL voltage in response to the output signal from the comparing unit.

15. The semiconductor memory device as recited in claim 14, wherein the voltage level shifter includes:
an amplifying unit for comparing the bandgap voltage with a feed-back voltage and amplifying the bandgap voltage to thereby output the amplified bandgap voltage;
a second driver which receives the amplified bandgap voltage for outputting the amplified bandgap voltage as the DLL voltage; and
a resistor unit for generating the feed-back voltage by voltage dividing the DLL voltage.

16. The semiconductor memory device as recited in claim 15, wherein the first driver and the second driver are PMOS drivers.

17. The semiconductor memory device as recited in claim 16, wherein the PMOS driver included in the first driver is operated at a linear region.

18. The semiconductor memory device as recited in claim 16, wherein a size of the PMOS transistor included in the first driver is larger than that of the PMOS transistor included in the second driver.

19. The semiconductor memory device as recited in claim 15, wherein the resistor unit includes a plurality of resistors which are connected between an output of the second driver and a ground voltage.

20. The semiconductor memory device as recited in claim 14, wherein the comparing unit receives the external power supply voltage to compare the bandgap voltage with the feed-back voltage.

* * * * *